(12) United States Patent
Born et al.

(10) Patent No.: US 12,176,064 B2
(45) Date of Patent: Dec. 24, 2024

(54) APPARATUS AND METHODS EMPLOYING ASYNCHRONOUS FIFO BUFFER WITH READ PREDICTION

(71) Applicant: Advanced Micro Devices, Inc., Santa Clara, CA (US)

(72) Inventors: Richard Martin Born, Fort Collins, CO (US); David M. Dahle, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 282 days.

(21) Appl. No.: 17/559,131

(22) Filed: Dec. 22, 2021

(65) Prior Publication Data
US 2023/0197130 A1  Jun. 22, 2023

(51) Int. Cl.
*G11C 7/22* (2006.01)
*G06F 5/06* (2006.01)
*G11C 7/10* (2006.01)

(52) U.S. Cl.
CPC ............... *G11C 7/222* (2013.01); *G06F 5/06* (2013.01); *G11C 7/1039* (2013.01); *G11C 7/1057* (2013.01); *G11C 7/1078* (2013.01); *G06F 2205/061* (2013.01)

(58) Field of Classification Search
CPC ... G06F 2205/061; G06F 5/06; G11C 7/1039; G11C 7/1057; G11C 7/1078; G11C 7/222
See application file for complete search history.

(56) References Cited

U.S. PATENT DOCUMENTS

| | | | |
|---|---|---|---|
| 10,168,989 B1 * | 1/2019 | Shou | G06F 5/065 |
| 2015/0067384 A1 * | 3/2015 | Rozario | G06F 13/00 713/502 |
| 2018/0095910 A1 | 4/2018 | Kulick et al. | |
| 2022/0317755 A1 * | 10/2022 | Magro | G06F 1/3275 |

OTHER PUBLICATIONS

International Search Report and Written Opinion, PCT/US2022/052295, Apr. 24, 2023, 9 pages.

* cited by examiner

*Primary Examiner* — Terrell S Johnson

(57) ABSTRACT

Methods and apparatus employ an asynchronous first-in-first-out buffer (FIFO), that includes a plurality of entries. Control logic determines a timing separation between a write header valid signal and corresponding write data valid signal for a write operation to an entry in the first-in-first-out buffer (FIFO) and performs a read of the corresponding data from the entry in the FIFO in the second clock domain, based on the determined timing separation of the write header valid signal and corresponding write data valid signal, and based on a clock frequency ratio between the first and second clock domains.

20 Claims, 7 Drawing Sheets

FIG. 7

# APPARATUS AND METHODS EMPLOYING ASYNCHRONOUS FIFO BUFFER WITH READ PREDICTION

BACKGROUND OF THE DISCLOSURE

A processor typically employs one or more clock signals to synchronize logic operations at modules of the processor, thereby preventing errors such as setup errors, race conditions, and the like. A typical processor employs different clock signals for different portions of the processor, wherein each processor portion is referred to as a clock domain. The clock signals for the different clock domains are relatively independent of each other, allowing the logic operations of different clock domains to be synchronized independently of other clock domains. For example, the processor can synchronize the different clock domains with clock signals of different frequencies, thereby improving processing efficiency. Further, the independence of the clock signals supports simplified clock management and signal routing at the processor. However, in many instances data must be communicated between modules of different clock domains, resulting in asynchronous clock crossings. Improperly managing data transfer across asynchronous crossing can result in data loss and increased latency.

First-in-first-out buffers (FIFO) are used between processing cores and data fabrics in processing systems, such as in data centers and other applications, to provide read/write data for the cores and other memory clients. Processing cores such as central processing unit (CPUs), Graphics processing units (GPUs) and other memory clients can be very sensitive to data latencies when reading or writing data. Asynchronous FIFOs operate across multiple different clock domains. For example, they process writes at a first clock frequency of a first clock domain and processes reads at a second clock frequency of a second and faster or slower clock domain. Data may enter a FIFO in a staggered fashion. For example, a write header is written in cycle X with corresponding data written in cycle X+N. The reading side of the FIFO may have a similar requirement where read control logic wants to read the header from the same entry in cycle Y and read the data in cycle Y+M. The desire is to know when the start cycle Y can begin so that by the time the read logic attempts to read the data, it is known to be valid. When doing this across an asynchronous crossing, managing this difference has resulted in undue latency, such an undue read latency.

BRIEF DESCRIPTION OF THE DRAWINGS

The implementations will be more readily understood in view of the following description when accompanied by the below figures, wherein like reference numerals represent like elements, and wherein.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF IMPLEMENTATIONS

Briefly, a method and apparatus determine a timing separation between a write header and corresponding write data for a write operation to an entry in an asynchronous first in first out (FIFO). The method and apparatus perform a read of the corresponding data from the entry in the asynchronous FIFO based on the determined timing separation of the write header and corresponding write data, and also based on a clock frequency ratio between a first and second clock domain that is used by the asynchronous FIFO. This allows the consumption of read data from the FIFO sooner than other methods. In some examples, a type of feed forward determination is used based solely off of the writing domain as opposed to systems that use a round trip computation that needs to utilize both write and read looks from the FIFO. Stated another way, a type of feed forward read prediction is used and is based on the timing separation between the write header and write data.

In some implementations, control logic detects or is told that a change in frequency has occurred in one of the clock domains used by the asynchronous FIFO and determines whether the feed forward read prediction operation should be employed. In some examples, a maximum timing separation between a read header and read data is stored in a register and the control logic enables the feed forward process to operate if a detected separation is less than or equal to the maximum timing separation.

In certain implementations, a processor includes a first-in-first-out buffer (FIFO), such as an asynchronous FIFO, that includes a plurality of entries. The FIFO processes writes at a first clock frequency of a first clock domain and processes reads at a second clock frequency of a second clock domain, the second clock signal asynchronous with the first clock signal. Control logic determines a timing separation between a write header valid signal and corresponding write data valid signal for a write operation to an entry in the first-in-first-out buffer (FIFO); and performs a read of the corresponding data from the entry in the FIFO in the second clock domain, based on the determined timing separation of the write header valid signal and corresponding write data valid signal, and based on a clock frequency ratio between the first and second clock domains. The processor is operative to issue one or more read requests for data in the FIFO.

In some implementations the control logic performs a translation of the timing separation between the write header valid signal and corresponding write data valid signal to the second clock frequency for a read operation to the entry; and determines a number of wait cycles before issuing a pipeline read transaction start signal, based on the translation and based on a known number of transaction pipeline cycles needed to process a read header and corresponding read data.

In certain implementations the control logic performs the read by issuing a pipeline read transaction start signal prior to write data being designated as valid wherein the write header valid signal and write data valid signal have a known separation in write clocks and uses a number of pipeline transaction cycles in read cycles between the read header and read data to determine when to issue the pipeline read transaction start signal.

In certain implementations the control logic predicts when read data will be valid in the entry based on the determined timing separation and the clock frequency ratio and issues a pipeline read transaction start signal for a read pipeline to obtain the read data from the entry based on the prediction.

In certain examples, the control logic enables the performing of the read of the corresponding data from the entry in the FIFO in the second clock domain in response to determining that the timing separation between a write header and corresponding write data equals or exceeds a timing separation threshold. In some examples, the control logic stores data representing a number of separation clock cycles for the entry to be read out of the FIFO.

In certain examples, the control logic includes a cycle margin value into the data representing a number of separation clock cycles to account for delays in a read processing pipeline. In some examples, the processor includes at least one register configured to store the data representing the number of separation cycles and the clock frequency ratio.

In certain implementations, a method carried out by at least one processor, determines a timing separation between a write header valid signal and corresponding write data valid signal for a write operation to an entry in the first-in-first-out buffer (FIFO) that includes a plurality of entries. The method includes processing writes at a first clock frequency of a first clock domain and processing reads at a second clock frequency of a second clock domain, the second clock signal is asynchronous with the first clock signal. In some implementations the method includes performing a read of the corresponding data from the entry in the FIFO in the second clock domain, based on the determined timing separation of the write header valid signal and corresponding write data valid signal and based on a clock frequency ratio between the first and second clock domains.

In some examples, the method includes performing a translation of the timing separation between the write header valid signal and corresponding write data valid signal to the second clock frequency for a read operation to the entry; and determining a number of wait cycles before issuing a pipeline read transaction start signal, based on the translation and based on a known number of transaction pipeline cycles needed to process a read header and corresponding read data.

In certain implementations the method includes performing the read by issuing a pipeline read transaction start signal prior to write data being designated as valid wherein the write header valid signal and write data valid signal have a known separation in write clocks and wherein the control logic uses a pipeline transaction cycle in read cycles between the read header (e.g., read header valid signal) and read data (e.g., read data valid signal) to determine when to issue the pipeline read transaction start signal.

In some implementations, the method includes predicting when read data will be valid in the entry based on the determined timing separation and the clock frequency ratio and operative to issue a pipeline read transaction start signal for a read pipeline to obtain the read data from the entry based on the prediction.

In some implementations, a system includes at least one processor that includes an asynchronous first-in-first-out buffer (FIFO) having a plurality of entries; a first clock domain operative at a first clock frequency and including: at least one write header queue configured to store a write header; at least one write data queue configured to store write data corresponding to the write header; write control logic that determines a timing separation between the write header valid signal and corresponding write data valid signal for a write operation to an entry in the FIFO. The system includes a second clock domain operative at a second a different clock frequency, and includes read header logic configured to provide a read header; read data logic configured to provide read data corresponding to the read header; a read transaction pipeline. The system includes control logic that performs a read of the corresponding data from the entry in the FIFO in the second clock domain, based on the determined timing separation of the write header valid signal and corresponding write data valid signal, and based on a clock frequency ratio of the first clock frequency and the second clock frequency.

In certain implementations the control logic performs the read by issuing a pipeline read transaction start signal for the pipeline prior to write data being valid in the entry.

In some implementations, the control logic performs a translation of the timing separation between the write header valid signal and corresponding write data valid signal to the second clock frequency for a read operation to the entry; and determines a number of wait cycles before issuing a pipeline read transaction start signal, based on the translation and based on a known number of transaction pipeline cycles needed to process a read header and corresponding read data.

In certain implementations control logic enables the performing of the read of the corresponding data from the entry in the FIFO in the second clock domain in response to determining that the timing separation between a write header valid signal and corresponding write data valid signal equals or exceeds a timing separation threshold.

In some implementations the system includes a processing core that issues at least one of: a read request and a write request for data in the FIFO and a data fabric coupled to the FIFO to provide write data for the FIFO.

In certain implementations, an asynchronous FIFO includes control logic that determines a timing separation between a write header valid signal and corresponding write data valid signal for a write operation to an entry in the first-in-first-out buffer (FIFO); and performs a read of the corresponding data from the entry in the FIFO in the second clock domain, based on the determined timing separation of the write header and corresponding write data, and based on a clock frequency ratio between the first and second clock domains.

In some implementations, the control logic performs a translation of the timing separation between the write header valid signal and corresponding write data valid signal to the second clock frequency for a read operation to the entry.

In certain implementations, the control logic performs the read by issuing a pipeline read transaction start signal prior to write data being designated as valid wherein the write header valid signal and write data valid signal have a known separation in write clocks and wherein the control logic uses a number of pipeline transaction cycles in read cycles between the read header and read data to determine when to issue the pipeline read transaction start signal.

In some implementations, the control logic predicts when read data will be valid in the entry based on the determined timing separation and the clock frequency ratio and operative to issue a pipeline read transaction start signal for a read pipeline to obtain the read data from the entry based on the prediction.

In certain implementations the control logic enables the performing of the read of the corresponding data from the entry in the FIFO in the second clock domain in response to determining that the timing separation between a write header valid signal and corresponding write data valid signal equals or exceeds a timing separation threshold.

Figure 1:
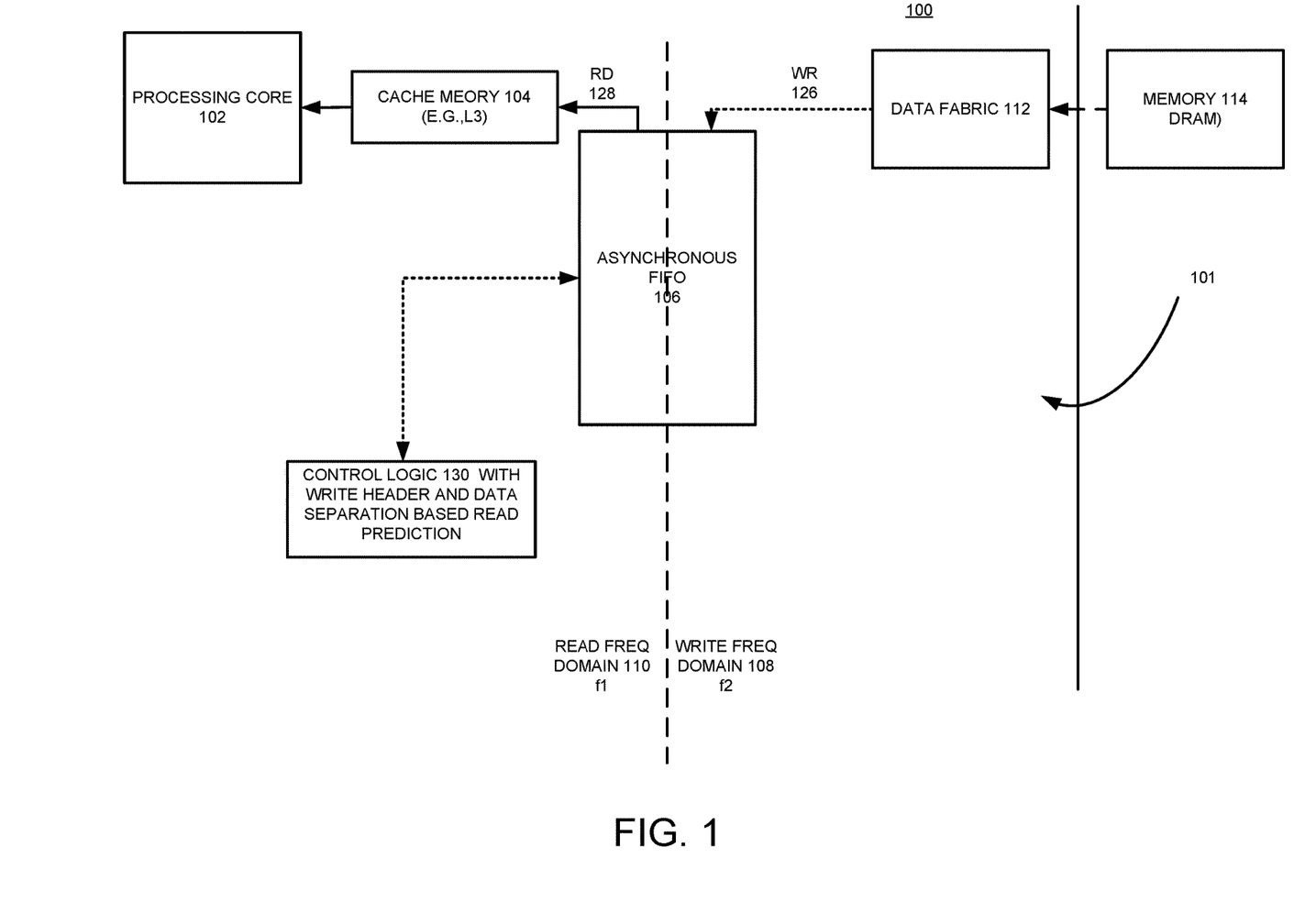
FIG. 1 is a block diagram illustrating one example of a system according to one example set forth in the disclosure.

FIG. 1 illustrates one example of a processing system 100 that employs a processor 101 that includes one or more processing cores 102 that utilize cache memory 104 such as L3 cache, in this example, which is coupled to an asynchronous FIFO 106 that operates at two different frequency domains namely a write clock domain 108 and a read clock domain 110. In this example, the clock frequency of the read clock domain 110 is faster than the clock frequency of the write clock domain 108. However, any suitable clock domain configuration may be employed. The processing system 100 includes a data fabric 112 that communicates data to and from memory 114 such as system memory or any other suitable memory which can be off chip memory that is shared by other processors. In some implementations, other users of the data fabric 112 and FIFO 106 include other processors in a data center or other data sources that have access to the FIFO 106.

In this example, the data flow is shown to be that the processing core 102 is attempting to read data from the asynchronous FIFO 106 that was written by the data fabric 112 into the FIFO 106. The write data is shown as 126 and the read data into the cache L3 for the processor 102 is shown as 128. The processing core 102 issues at least one of: a read request and a write request for data in the FIFO 106. The data fabric 112 is coupled to the FIFO 106 to provide write data for the FIFO 106. However, it will be recognized that the asynchronous FIFO operation described herein may be employed in any suitable system.

The processing system 100 in this example includes control logic 130 that provides read data prediction based on a timing separation between a write header and corresponding write data and based on a clock frequency ratio between the clock domains 108 and 110. In this example, the read clock domain 110 is faster that the write clock domain 108. The frequency ratio is used in some examples to predict when the write data is likely to arrive so that control logic 130 can start reading the read header earlier that conventional asynchronous FIFOs. Also, the frequency ratio indicates precisely whether the data arrived in time or not and is used to translate the timing separation from the write domain to the read domain.

The processor 101, for example, may be any suitable digital device that uses an asynchronous FIFO, such as but not limited to one or more of a central processing unit (CPU), graphics processing unit (GPU), a data center processor, a microcontroller, a machine learning processor, a media processor, an image processor or any other suitable device or devices.

The FIFO 106 includes entries and processes writes at a first clock frequency of a first clock domain 108 and processes reads at a second clock frequency of a second clock domain 110 wherein the second clock signal is asynchronous with the first clock signal. It will be recognized that the FIFO 106 includes conventional control logic to track and control reads and writes to occur from a same entry within the FIFO.

The processing system 100 includes a processor 101 that in some examples, includes the data fabric 112, FIFO 106, control logic 130, cache memory 104 and one or more processing cores 102, in other examples, an interface to the data fabric is included on the processor to interface with an off-chip data fabric if desired. It will be recognized that any suitable system on-chip configuration, die configuration or any other configuration may be employed.

Figure 2:
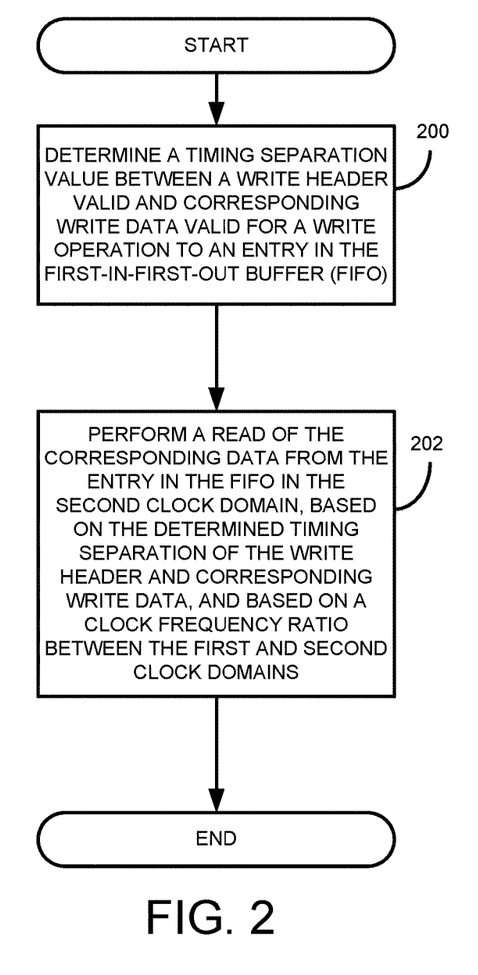
FIG. 2 is a flowchart illustrating a method for processing read requests using an asynchronous FIFO in accordance with one example set forth in the disclosure.
Figure 3:
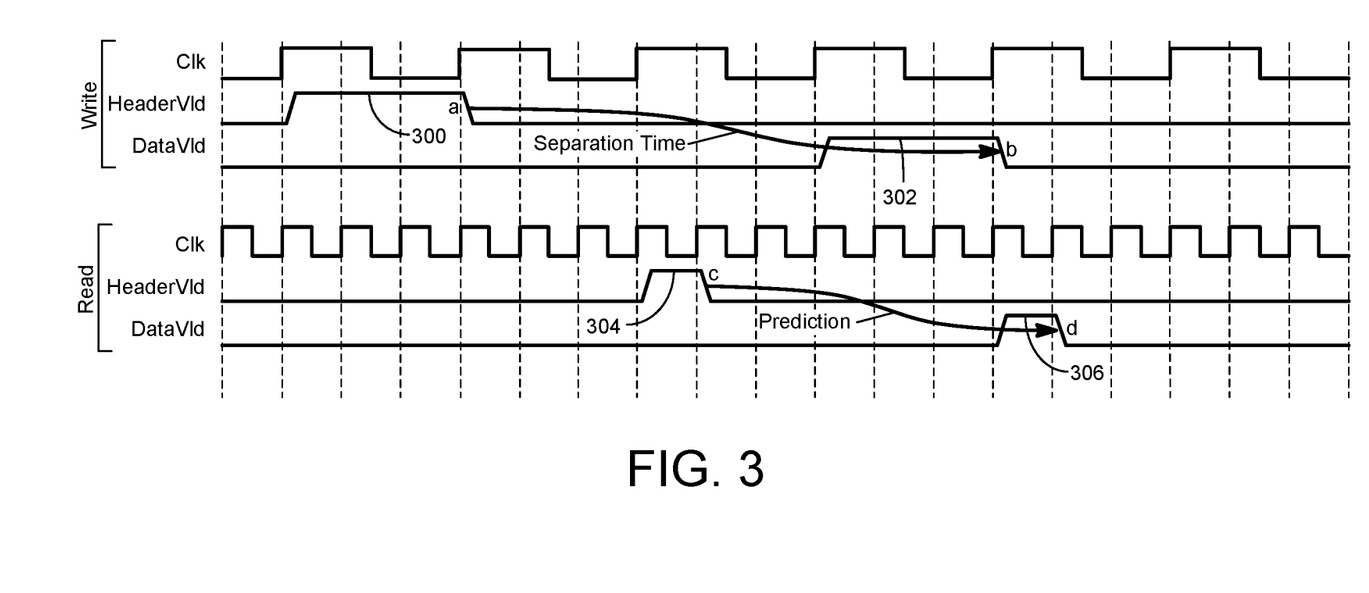
FIG. 3 is a timing diagram illustrating a read prediction in accordance with one example set forth in the disclosure.

Referring to FIG. 2 and FIG. 3, FIG. 2 is a flowchart illustrating a method for processing one or more read requests from the asynchronous FIFO 106 that, in one example, is carried out by the control logic 130. It will be recognized that if desired, the operations of the control logic 130 can be distributed among differing functional blocks. FIG. 3 is an example timing diagram illustration of read data prediction. As shown in block 200, the method includes determining a timing separation between a write header 300 (also referred to as write header valid signal) and corresponding write data 302 (also referred to as write data valid signal) for a write operation to an entry in the FIFO 106. In the example shown in FIG. 3, a write header valid signal and a corresponding write data valid signal are used to determine the write header and write data separation. In this example, a three-cycle separation is shown between the header valid falling edge and the data valid falling edge illustrated as "a" and "b". The control logic 130 includes counters to determine the timing separation. However, any suitable clock detection circuitry may be employed. In some implementations, the relationship between the write header/data and read header/data are known in advance since the hardware pipeline tracks the relationship and is constant. The control logic keeps track of the number of transactions in flight to delay the transition from predictive to non-predictive modes and normal FIFO ordering rules.

As shown in block 202, the method includes performing a read of the corresponding data from the entry in the FIFO 106 based on the determined timing separation of the write header valid signal and the corresponding write data valid signal and based on a clock frequency ratio between the first and second clock domains 108 and 110. In this example, this is represented as the ratio of the write clock frequency F2 and the read clock frequency F1. In some implementations, this value is stored in a control register. However, any suitable mechanism may be used to obtain the read and write frequencies. The control logic 130 predicts when read data will be valid in the entry based on the determined timing separation and the clock frequency ratio. One example shown as the "prediction" in FIG. 3 of issuing the header so that the read header valid signal 304 is used to predict when read data valid signal 306 should be complete. The prediction timing is shown as the falling edge "c" to falling edge "d" of the read header valid signal and read data valid signal in this example.

In conventional systems, control logic would wait to issue the header valid until the write data valid signal has been issued. In this example, the read operation for a read transaction in a pipeline, for example, is started before the write data valid signal 302 signal is received by the control logic 130. In some implementations, the control logic performs the read by issuing a read header prior to write data being designated as valid.

In some implementations, the control logic 130 performs a translation of the timing separation between the write header and corresponding write data to the second clock frequency for a read operation to the entry. For example, one calculation for the translation is represented as: separationCycles in read periods=(separationTime in write periods+margin+period of the read clock−1)/period of the read clock. For example, in the example of FIG. 3, the translation results in a six-cycle read clock separation between the read header valid signal 304 signal and the corresponding read data valid signal 306 signal 306 respectively. In the example shown, there are 3 cycles of write separation and 7 cycles of read separation.

In some implementations, the FIFO 106 is enabled to operate in a normal asynchronous mode and in a read data prediction mode. In some implementations, the control logic 130 enables the performing of the read of the corresponding data from the entry in the FIFO in the second clock domain in response to determining that the timing separation between a write header and corresponding write data equals or exceeds a timing separation threshold, such as a maximum allowable timing separation threshold. In some implementations, the timing separation threshold is stored in a register accessible by the control logic. In some examples, the control logic 130 is implemented as a programmable controller that is programmed with firmware that operates as described herein. In other examples, the control logic is implemented as one or more state machines or any other suitable logic including, but not limited to, a field programmable gate array.

Figure 4:
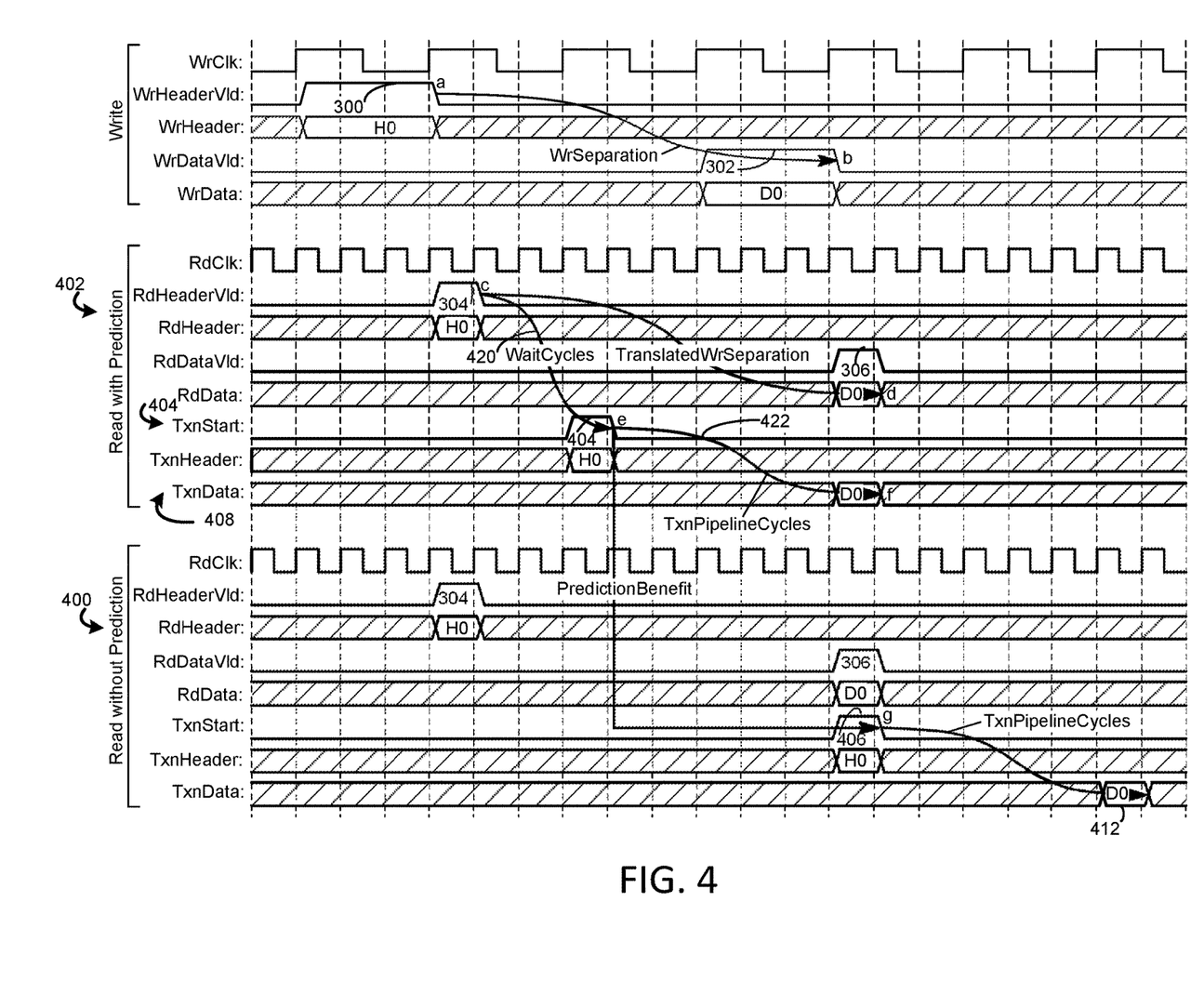
FIG. 4 is a timing diagram illustrating a read prediction in accordance with one example set forth in the disclosure

FIG. 4 is a timing diagram illustrating one example of a read operation performed without prediction illustrated by signals 400 such as through the normal asynchronous FIFO operating mode, and a read operation performed when the read data prediction operation is enabled as shown by signals 402. As seen, when the read data prediction operation is enabled, a read is performed so that a transaction start signal 404 to initiate, for example, a read operation in a read pipeline that uses the FIFO, is initiated sooner than a transaction start done in the conventional asynchronous FIFO read operation mode shown by signals 400. This is shown by the early initiation of the transaction start signal 404 compared to a later transaction start signal 406. Stated another way, the transaction start signal 404 is a delayed read header valid signal 304 that is delayed from issuance to a read pipeline by a scheduler by a number of wait cycles until read data is expected to be present in the FIFO entry when the pipeline processing of a read header and read data is complete.

As shown, the disclosed read data prediction operation allows the transaction start to occur earlier than conventional asynchronous FIFO operations so that the transaction data valid 408 signal is aligned with the read data valid signal 306. The read prediction operation reduces read latency and enhances system speed in performing read operations with asynchronous FIFOs. As shown, without the read prediction operation, the transaction data valid signal 412 occurs many cycles after the transaction data valid 408. As described herein, the cycles referenced can be on the order of picoseconds, however any suitable clock frequencies may be employed.

Figure 5:
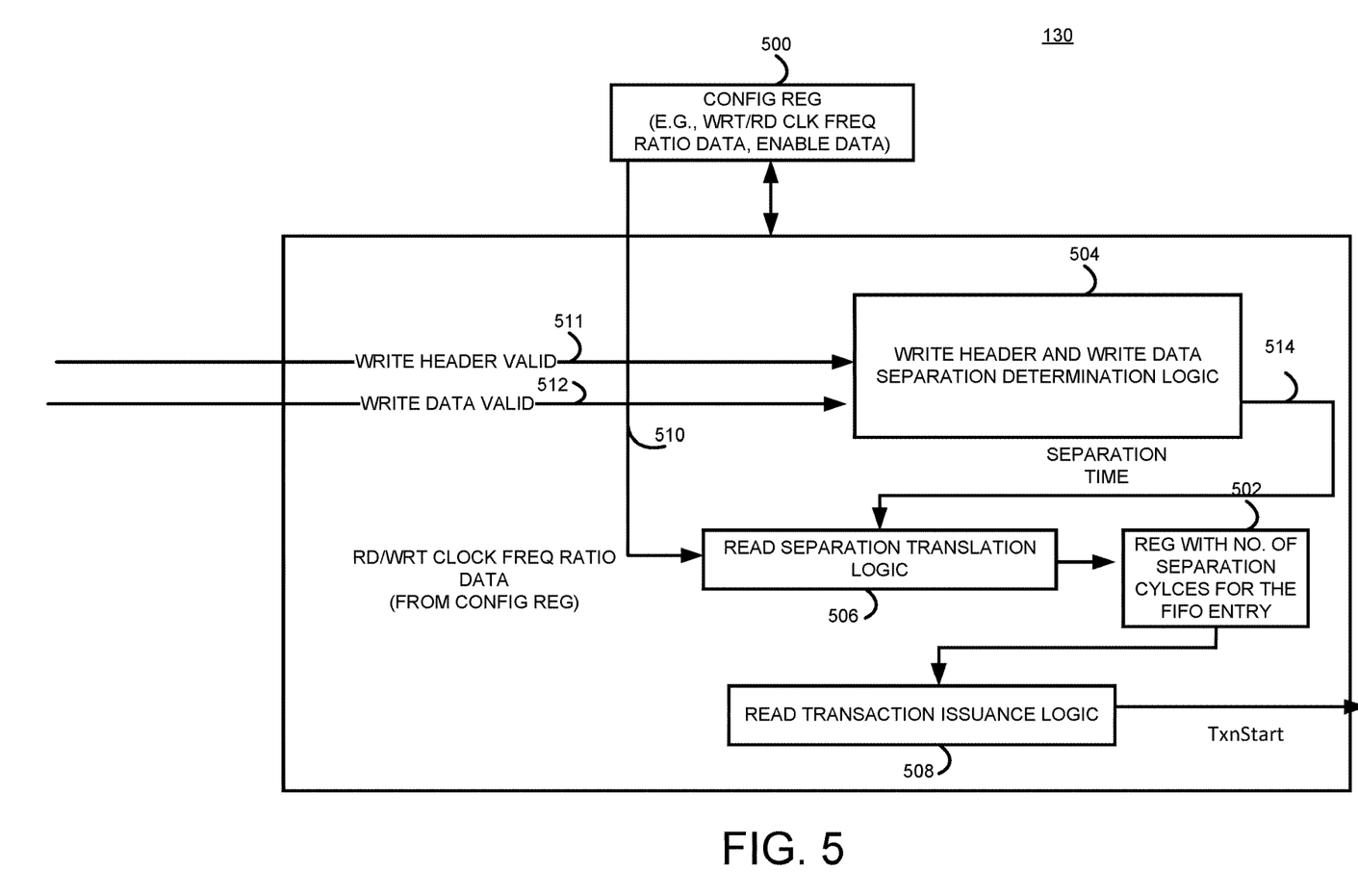
FIG. 5 is a block diagram illustrating one example of an asynchronous first-in-first-out buffer in accordance with one example set forth in the disclosure.

FIG. 5 is a block diagram illustrating one example of the control logic 130 and in this example includes one or more registers 500 such as configuration registers that in this example store data representing the write and read clock frequency ratio data, data indicating whether the control logic is enabled to perform the read prediction operation as described herein to reduce read latency or disable so that normal asynchronous operation is used by the FIFO. In this example, the control logic 130 includes write header and write data separation determination logic 504, read separation translation logic 506, and read transaction issuance logic 508. The functional blocks as shown herein in some implementations are implemented as firmware that is executed by a controller, and in other implementations, is implemented as one or more state machines configured to interface with one or more registers. In operation, the write header and write data separation determination logic 504 determines a timing separation between a write header valid 511 and corresponding write data valid 512 by, for example, using a counter to determine the cycles between the rising or falling edges of a header valid signal and data valid signal for data for a given FIFO entry as shown, for example, in FIG. 3.

The read separation translation logic 506 translates the timing separation data 514 from the write clock domain to the read clock domain. For example, the read write clock frequency ratio data 510 is used to translate the number of timing separation cycles between the write header valid and write data valid signals into corresponding read header valid and read data valid signals 304 and 306 shown in FIG. 3. In some examples, a register 502 includes a number of separation cycles for the FIFO entry, that includes a number of margin cycles that are added to a read header and read data separation to account for delays in a read processing pipeline. In some examples, the number of separation cycles for the FIFO entry is a maximum number of separation clock cycles for the entry to be read out of the FIFO. The number of separation clock cycles includes, in some examples, the addition of a cycle margin value. The register 502 stores the data representing the number of separation cycles. The register 500 stores the clock frequency ratio.

The read transaction issuance logic 508 issues the transaction start signal 404 to start the read processing pipeline 540 start processing the read header and obtain data from the FIFO for a requesting processor. The transaction issuance logic serves as a type of scheduler to schedule read transactions for the FIFO. The issuance logic 508 waits the wait cycles 420 before launching the transaction start signal (e.g., delayed RdHeaderVld) so that the predicted time it takes for the read data to actually be available to read (e.g., RdDataVld) is within a number of transaction pipeline cycles to complete the execution of the read header and read data.

An operation description of the control logic for an embodiment is described below. However, any suitable process may be employed. FIG. 4 illustrates the various signals and relationships. For example, the TxnPipelineCycles is the number of cycles that the read pipeline uses to complete a read (to obtain the transaction data (TxnData) from the FIFO once the transaction start signal (TxnStart) is issued to the pipeline).

For example, control logic initializes settings and defines values such as the period of the write clock (PeriodWrClk in picoseconds), the period of the read clock (PeriodRdClk in picoseconds) a cycle margin value (Margin in picoseconds) to account for delays in a read processing pipeline, a number of write separation cycles (WrSeparationCycles), a number cycles it takes for a transaction to complete in the pipeline (TxnPipelineCycles), a wait cycles valid flag (WaitCyclesValid) indicating whether a number of wait cycles is less than a maximum and a number of wait cycles (WaitCycles). In one example, in operation the control logic computes the write separation time in the write clock (WrClk) domain such that WrSeparationTime=PeriodWrClk*WrSeparationCycles (in picoseconds). The control logic translates the WrSeparationTime into the read clock (RdClk) domain (e.g., rounding up)

such that TranslatedWrSeparation=(WrSeparationTime+Margin+PeriodRdClk−1)/PeriodRdClk.

If the (TranslatedWrSeparation>MAX_WRite_Separation) where the MAX_Write_Separation is the separation supported by the processing pipeline—which is known by the control logic, then the control logic sets the WaitCycles flag=0 and the WaitCyclesValid flag=0; and the control logic operates in the conventional asynchronous mode. Otherwise, the control logic operates in predictive mode if (TranslatedWrSeparation>TxnPipelineCycles), and the control logic calculates the wait cycles to be WaitCycles=TranslatedWrSeparation−TxnPipelineCycles and sets the WaitCyclesValid flag=1. Otherwise, the control logic sets WaitCycles=0 and WaitCyclesValid=1.

Figure 6:
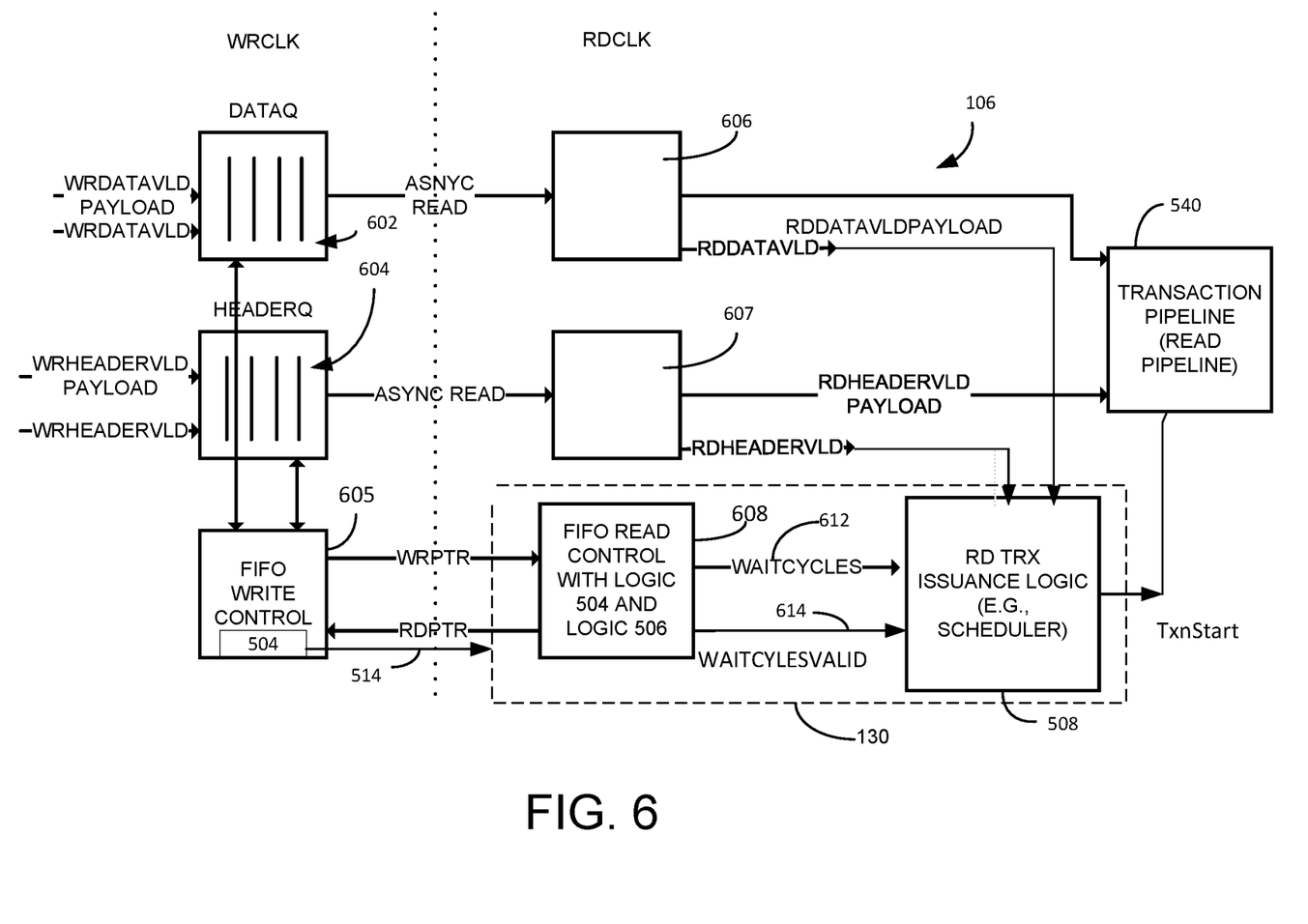
FIG. 6 is a block diagram illustrating one example of an asynchronous first-in-first-out buffer in accordance with one example set forth in the disclosure.

FIG. 6 is a block diagram illustrating one example of the FIFO 106 and control logic 130 in further detail. In this example the asynchronous FIFO operates in either a normal asynchronous mode or in a prediction mode that utilizes the prediction operation described above with reference to FIGS. 1-5. As illustrated, the first-in-first-out buffer (FIFO) 106 has a write data queue 602 and corresponding write header queue 604 each with a plurality of entries shown by solid lines. The FIFO 106 includes a FIFO write control block 605 that controls the writing of the header and corresponding data in the queues in the write clock domain as known in the art. The FIFO 106 includes a corresponding read data queue 606 and read header queue 607 and FIFO read control block 608 that performs asynchronous reads from the write queues 602 and 604 as known in the art using the read clock. In this example, the control logic 130 incudes the FIFO read control block 608. The logic 130 determines a timing separation between the write header and corresponding write data for a write operation to an entry in the FIFO, provides the timing separation so that it can be translated to the read clock domain and performs the translation using the clock frequency ratio and issues the TXnStart signal as shown above.

In this example, the FIFO read control block 608 also includes logic 504 and 506 to perform prediction and generate the wait cycles data 612 (WaitCycles) and waitcyclesvalid flag 614 (WaitCyclesValid) per the description above. In this example the FIFO write control 605 includes the separation determination logic 504. However, it will be recognized that the various function block may be located in other blocks or may combined as desired. In operation, read transaction issuance logic issues the TXNStart signal (also referred to as a pipeline read transaction start signal) by evaluating the WaitCycleValid flag. If WaitCycleValid=0, meaning operate in the conventional asynchronous mode (the non-prediction asynchronous mode), then the TxnStart is issued as signal 406 namely RdDataVld. If WaitCycleValid=1, meaning operate in the asynchronous prediction mode, then TxnStart is start signal 404 which is the Wait cycle delayed version of signal 304 namely a delayed RdHeaderVld signal 304.

In some examples, when in the prediction mode, the FIFO read control block 608, performs a read of the corresponding data from the entry in the FIFO in the second clock domain, based on the determined timing separation of the write header and corresponding write data, and based on the clock frequency ratio as previously described above. The read of the data from the FIFO in this example is done by using the transaction pipeline (such as a flip-flop based pipeline that is considered part of the control logic). The read transaction issuance logic 508 keys off of the RdHeaderVld signal 304 and the RdDataVld signal 306 and delays the start of the read transaction for the read pipeline 540 until after the read header valid signal but early enough to allow for the full transaction pipeline cycles (TxnPipelienCycles) to be met (as shown in FIG. 4). Without prediction, as shown in FIG. 4 by signals 400, prior systems without prediction would not predict to initiate an earlier transaction start signal using wait cycles based on the read header valid signal but instead waited for the read data valid signal to initiate the start of the read transaction of the read pipeline resulting in transaction read data being read from the FIFO many cycles after the read data valid signal 306.

Stated another way, the FIFO read control block 608 serves as a read controller that performs the read by issuing a delayed read header (e.g., TxnStart) for a read pipeline prior to write data being valid in the entry. The read controller predicts a delay number of cycles (e.g., the number of wait cycles) before issuing the read header associated with the read operation based on the determined timing separation and based on the determined clock frequency ratio.

In certain implementations, the control logic always provides the RdHeaderVld and RdDataVld based solely on the async FIFO determinations in all modes (predictive or async). When the header is read, the WaitcycleVLD flag is also read. If WaitcyclesVld==1, the control logic is in the predictive mode and the WaitCycles indicates the number of read clock cycles to wait before processing the read header, knowing that the data corresponding to the header will be available cycles later.

Figure 7:
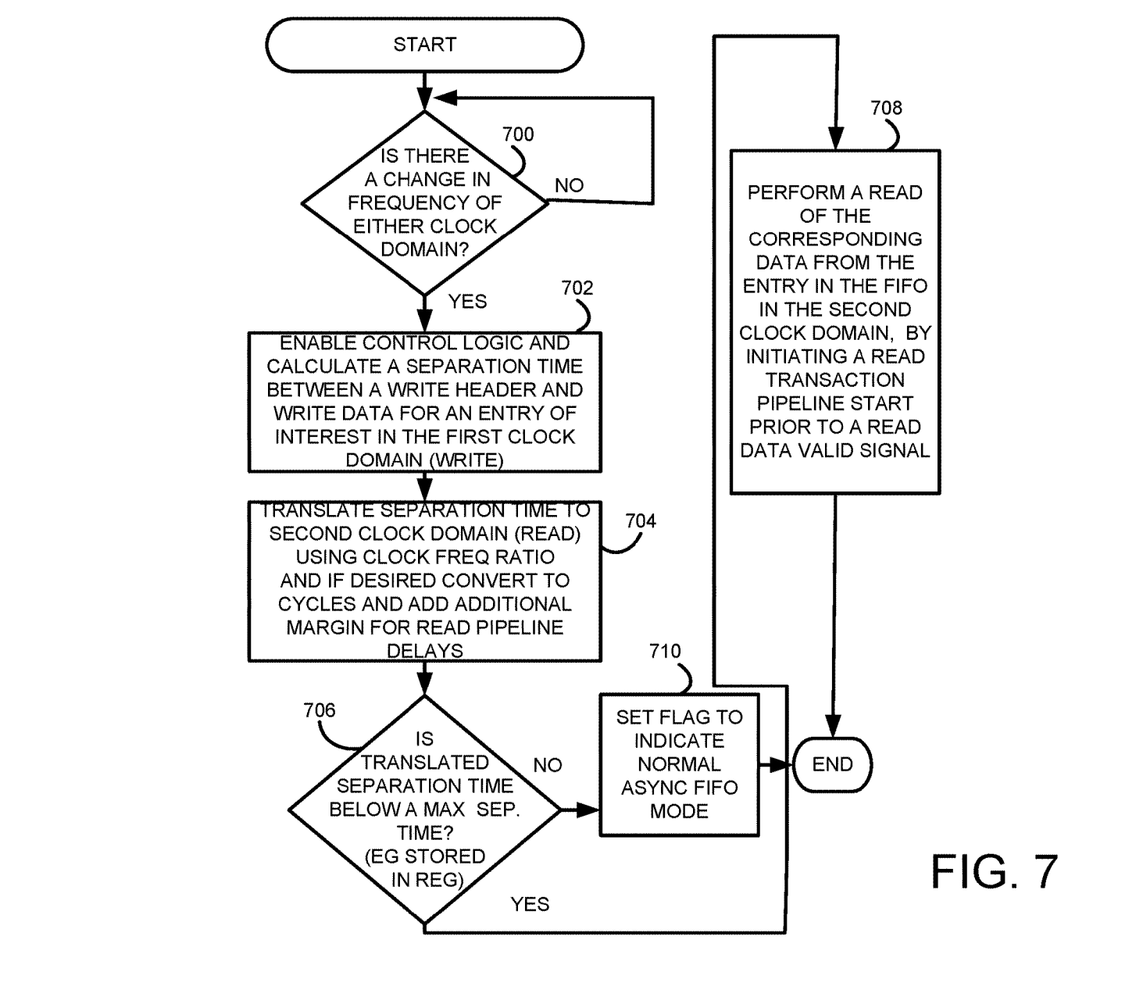
FIG. 7 is a flow chart illustrating a method for processing read requests using an asynchronous FIFO in accordance with one example set forth in the disclosure.

FIG. 7 is a flowchart illustrating one example of a method for controlling an asynchronous FIFO. The steps may be performed in any suitable order. The method is carried out, in some implementations, by the control logic 130. As shown in block 700, the method includes determining if there is a change in frequency of the clock of either clock domain 110 or 108. For example, if the write clock is increased or slowed down or the read clock is increased or slowed down, which may be detected through register control or other suitable mechanism, the control logic 130 enables, as shown in block 702, the operation of determining whether or not the change in clock frequency that has been detected is of a suitable amount to allow use of the read prediction operation (mode) as opposed to simply operating the asynchronous FIFO in a conventional manner. For example, the control logic calculates a separation time between a write header and write data for an entry of interest in the write clock domain, as shown in block 704, and translates the separation time into the read clock domain using the clock frequency ratio. If margin cycles are also employed such as additional margins for read pipeline delays, this time is also added into the calculation as shown above. If the translated separation time is below a maximum separation time, as shown in block 706, the control logic performs a read of the corresponding data from the entry in the FIFO in the second clock domain, by initiating a read transaction pipeline start prior to a read data valid signal being completed as shown in block 708. If, however the translated separation time is above a maximum separation time as shown in block 710, a flag is set to indicate to operate in a normal asynchronous FIFO mode. This is because, for example, the number of cycles that are needed exceeds the maximum allowable that can be accommodated.

Among other advantages, a reduced read latency operation is provided that allows faster reads to occur for asynchronous FIFO operations. In some implementations, a number of wait cycles indicates the number of read cycles for a downstream read processing pipeline to wait before the pipeline processes the read header knowing that the read data corresponding to the read header will be available some cycles later. In some examples, a frequency ratio between the write clock and the read clock, the read clock being faster than the write clock, is used to predict an expected read header in the read clock domain based on the timing separation between a write header and corresponding write data in the write frequency domain. A read data prediction operation is based on a type of feed forward or one direction computation as opposed to conventional asynchronous FIFO operations that require round trip tracking of writes and reads. The disclosed read data prediction operation in some implementations is based solely off of the receiving domain, meaning in this case the write domain and not based on round trip read and write data valid techniques. In some implementations, the disclosed hardware, namely the control logic and FIFO, perform a prediction evaluation when frequency changes occur. Other benefits will be appreciated by those skilled in the art.

Although features and elements are described above in particular combinations, each feature or element can be used alone without the other features and elements or in various combinations with or without other features and elements. The apparatus described herein in some implementations use software or firmware incorporated in a non-transitory computer-readable storage medium for execution by a general-purpose computer or a processor. Examples of computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the disclosure may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. A processor comprising:
a first-in-first-out buffer (FIFO) comprising a plurality of entries and operative to process writes at a first clock frequency of a first clock domain and process reads at a second clock frequency of a second clock domain, the second clock domain asynchronous with the first clock domain;
control logic configured to:
in response to a change in frequency of either of the first clock frequency or the second clock frequency, calculate a timing separation between a write header valid signal and corresponding write data valid signal for a write operation to an entry in the FIFO; and
perform a read of the corresponding data from the entry in the FIFO in the second clock domain, based on the timing separation of the write header valid signal and corresponding write data valid signal, and based on a clock frequency ratio between the first and second clock domains.

2. The processor of claim 1 wherein the control logic is operative to:
in response to the timing separation being within a desired separation time, perform a translation of the timing separation between the write header valid signal and corresponding write data valid signal to the second clock frequency for a read operation to the entry; and
calculate a number of wait cycles before issuing a pipeline read transaction start signal, based on the translation and based on a known number of transaction pipeline cycles needed to process a read header and corresponding read data.

3. The processor of claim 1 wherein the control logic is operative to perform the read by issuing a pipeline read transaction start signal prior to write data being designated as valid wherein the write header valid signal and write data valid signal have a known separation in write clocks and wherein the control logic uses a number of pipeline transaction cycles in read cycles between a read header and read data to determine when to issue the pipeline read transaction start signal.

4. The processor of claim 1 wherein the control logic is operative to predict when read data will be valid in the entry based on the timing separation and the clock frequency ratio and operative to issue a pipeline read transaction start signal for a read pipeline to obtain the read data from the entry based on the prediction.

5. The processor of claim 1 wherein the control logic is operative to enable the performing of the read of the corresponding data from the entry in the FIFO in the second clock domain in response to determining that the timing separation between a write header valid signal and corresponding write data valid signal equals or exceeds a timing separation threshold.

6. A method carried out by at least one processor, comprising:
in response to a change in frequency of either of a first clock frequency or a second clock frequency in different clock domains, calculating a timing separation between a write header valid signal and corresponding write data valid signal for a write operation to an entry in a first-in-first-out buffer (FIFO) comprising a plurality of entries operative to process writes at the first clock frequency of a first clock domain and process reads at the second clock frequency of a second clock domain, the second clock domain asynchronous with the first clock domain; and performing a read of the corresponding data from the entry in the FIFO in the second clock domain, based on the timing separation of the write header and corresponding write data and based on a clock frequency ratio between the first and second clock domains.

7. The method of claim 6 comprising;
in response to the timing separation being within desired separation time, performing a translation of the timing separation between the write header and corresponding write data valid signal to the second clock frequency for a read operation to the entry; and
determining a number of wait cycles before issuing a pipeline read transaction start signal, based on the translation and based on a known number of transaction pipeline cycles needed to process a read header and corresponding read data.

8. The method of claim 6 comprising performing the read by issuing a pipeline read transaction start signal prior to write data being designated as valid wherein the write header valid signal and write data valid signal have a known separation in write clocks and wherein the method comprises using a pipeline transaction cycle in read cycles between a read header and read data to determine when to issue the pipeline read transaction start signal.

9. The method of claim 6 comprising predicting when read data will be valid in the entry based on the timing separation and the clock frequency ratio and operative to issue a pipeline read transaction start signal for a read pipeline to obtain the read data from the entry based on the prediction.

10. The method of claim 6 comprising enabling the performing of the read of the corresponding data from the entry in the FIFO in the second clock domain in response to determining that the timing separation between the write header valid signal and corresponding write data equals or exceeds a timing separation threshold.

11. The method of claim 10 comprising including a cycle margin value into the data representing a number of separation clock cycles.

12. A system comprising:
at least one processor comprising:
an asynchronous first-in-first-out buffer (FIFO) having a plurality of entries;
a first clock domain operative at a first clock frequency and comprising:
at least one write header queue configured to store a write header;
at least one write data queue configured to store write data corresponding to the write header;
write control logic configured to, in response to a change in frequency of either of the first clock frequency or a second and different clock frequency, calculate a timing separation between a write header valid signal and corresponding write data valid signal for a write operation to an entry in the FIFO;
a second clock domain operative at the second and different clock frequency, and comprising:
read header logic configured to provide a read header;
read data logic configured to provide read data corresponding to the read header;
a read transaction pipeline; and
control logic configured to perform a read of the corresponding data from the entry in the FIFO in the second clock domain, based on the timing separation of the write header and corresponding write data, and based on a clock frequency ratio of the first clock frequency and the second clock frequency.

13. The system of claim 12 wherein the control logic is operative to, in response to the timing separation being within a desired separation time, perform the read by issuing a pipeline read transaction start signal for the pipeline prior to write data being valid in the entry.

14. The system of claim 12 wherein the control logic is operative to;
perform a translation of the timing separation between the write header valid signal and corresponding write data valid signal to the second clock frequency for a read operation to the entry; and
calculate a number of wait cycles before issuing a pipeline read transaction start signal, based on the translation and based on a known number of transaction pipeline cycles needed to process a read header and corresponding read data.

15. The system of claim 12 wherein the control logic is operative to enable the performing of the read of the corresponding data from the entry in the FIFO in the second clock domain in response to determining that the timing separation between a write header valid signal and corresponding write data valid signal equals or exceeds a timing separation threshold.

16. The system of claim 12 comprising a processing core operative to issue at least one of: a read request and a write request for data in the FIFO and a data fabric coupled to the FIFO operative to provide write data for the FIFO.

17. An asynchronous first-in-first-out buffer (FIFO) comprising:
a plurality of entries and operative to process writes at a first clock frequency of a first clock domain and process reads at a second clock frequency of a second clock domain, the second clock domain asynchronous with the first clock domain;
control logic configured to:
in response to a change in frequency of either of the first clock frequency or the second clock frequency, calculate a timing separation between a write header valid signal and corresponding write data valid signal for a write operation to an entry in the first-in-first-out buffer; and
perform a read of the corresponding data from the entry in the FIFO in the second clock domain, based on the timing separation of the write header and corresponding write data, and based on a clock frequency ratio between the first and second clock domains.

18. The asynchronous FIFO of claim 17 wherein the control logic is operative to, in response to the timing separation being within a desired separation time, perform a translation of the timing separation between the write header valid signal and corresponding write data valid signal to the second clock frequency for a read operation to the entry.

19. The asynchronous FIFO of claim 17 wherein the control logic is operative to perform the read by issuing a pipeline read transaction start signal prior to write data being designated as valid wherein the write header valid signal and write data valid signal have a known separation in write clocks and wherein the control logic uses a number of pipeline transaction cycles in read cycles between the read header and read data to determine when to issue the pipeline read transaction start signal.

20. The asynchronous FIFO of claim 17 wherein the control logic is operative to predict when read data will be valid in the entry based on the calculated timing separation and the clock frequency ratio and operative to issue a pipeline read transaction start signal for a read pipeline to obtain the read data from the entry based on the prediction.

* * * * *